United States Patent
Routh et al.

(10) Patent No.: US 11,293,808 B1
(45) Date of Patent: Apr. 5, 2022

(54) INTEGRATED CIRCUIT AND METHOD FOR CAPTURING BASELINE DIE TEMPERATURE DATA

(71) Applicant: DELPHI TECHNOLOGIES IP LIMITED, St. Michael (BB)

(72) Inventors: Soumyajit Routh, Kokomo, IN (US); Kevin M. Gertiser, Carmel, IN (US); Jack L. Glenn, Union Pier, MI (US); John Mark Dikeman, Burnside, KY (US); Daniel C. Penrod, Russiaville, IN (US)

(73) Assignee: Delphi Technologies IP Limited, St. Michael (BB)

( * ) Notice: Subject to any disclaimer, the term of this patent is extended or adjusted under 35 U.S.C. 154(b) by 0 days.

(21) Appl. No.: 17/363,739

(22) Filed: Jun. 30, 2021

(51) Int. Cl.
  *G01K 3/00* (2006.01)
  *G01R 31/3177* (2006.01)
  *G01R 31/317* (2006.01)
  *G01K 7/00* (2006.01)

(52) U.S. Cl.
  CPC .............. *G01K 3/005* (2013.01); *G01K 7/00* (2013.01); *G01R 31/3177* (2013.01); *G01R 31/31724* (2013.01)

(58) Field of Classification Search
  None
  See application file for complete search history.

(56) References Cited

U.S. PATENT DOCUMENTS

| 8,027,798 | B2 | 9/2011 | Johns et al. | |
| 10,352,782 | B2 | 7/2019 | Jokinen et al. | |
| 11,018,071 | B2* | 5/2021 | Pinkham | G06F 11/3058 |
| 2004/0095116 | A1* | 5/2004 | Kernahan | G06F 1/24 323/282 |
| 2004/0179576 | A1* | 9/2004 | Bowden | G01K 3/005 374/163 |
| 2005/0198547 | A1* | 9/2005 | Morse | G06F 1/26 713/330 |
| 2005/0273585 | A1* | 12/2005 | Leech | G06F 1/24 713/1 |
| 2008/0043556 | A1* | 2/2008 | Naie | G06F 1/206 365/212 |
| 2010/0013543 | A1* | 1/2010 | Kang | G01K 7/00 327/512 |

(Continued)

OTHER PUBLICATIONS

S. Lopez-Buedo, J. Garrido and E. I. Boemo, "Dynamically inserting, operating, and eliminating thermal sensors of FPGA-based systems," in IEEE Transactions on Components and Packaging Technologies, vol. 25, No. 4, pp. 561-566, Dec. 2002, doi: 10.1109/TCAPT.2002.808011. (Year: 2002).*

*Primary Examiner* — Daniel F. McMahon
(74) *Attorney, Agent, or Firm* — Joshua M. Haines; Bookoff McAndrews, PLLC (57) ABSTRACT

A method includes, responsive to an application of power to an IC, self-initializing the IC by asserting a reset signal for a reset period. Self-initializing the IC also includes, in response to an expiration of the reset period, deasserting the reset signal. Self-initializing the IC also includes, responsive to deasserting the reset signal, automatically obtaining first temperature data from at least one thermal sensing device associated with a die of the IC, and storing the first temperature data in a storage component of the IC.

20 Claims, 4 Drawing Sheets

(56) References Cited

U.S. PATENT DOCUMENTS

| | | | |
|---|---|---|---|
| 2011/0029813 A1* | 2/2011 | Gunderson | G11C 29/802 714/30 |
| 2012/0218012 A1* | 8/2012 | Nix | H03K 17/223 327/143 |
| 2015/0023386 A1 | 1/2015 | Sinha et al. | |
| 2015/0330841 A1* | 11/2015 | Kern | H05K 7/20209 700/275 |
| 2016/0363972 A1* | 12/2016 | McNally | G06F 1/206 |
| 2017/0255403 A1* | 9/2017 | Sharon | G11C 11/5642 |
| 2017/0345510 A1* | 11/2017 | Achtenberg | G11C 29/52 |
| 2018/0252597 A1* | 9/2018 | Jokinen | G01K 15/005 |
| 2018/0284736 A1* | 10/2018 | Celia | G06N 3/0445 |
| 2021/0123835 A1* | 4/2021 | Glennon | G01M 13/028 |

* cited by examiner

INTEGRATED CIRCUIT AND METHOD FOR CAPTURING BASELINE DIE TEMPERATURE DATA

TECHNICAL FIELD

This disclosure relates to integrated circuits, and in particular, to an integrated circuit and method for capturing baseline die temperature data for temperature calibration.

BACKGROUND

Integrated circuits (IC), such as analog signal ICs, digital signal ICs, or mixed signal ICs, typically comprise a set of electronic components, such as transistors or other suitable components, inseparably integrated on a small portion of semiconductor material (e.g., silicon or other suitable material) called a die. Modern ICs may integrate millions or billions of electronic components on a die, and may be used in various automotive applications, such as engine control units, power drive systems and antilock brake systems, and other kinds of applications such as desktop computers, laptop computers, mobile computing devices, tablet computing devices, home appliances, stereos, medical devices, and other electronic devices.

Performance, accuracy and/or longevity of components in an IC may depend on operating temperature. Temperature monitoring circuitry, including one or more thermal sensing devices at respective locations on the IC die, may be incorporated such that temperatures at the respective locations may be monitored and/or used to modify operation of the IC and/or used to determine the integrity of thermal paths from the IC to a printed circuit board assembly (PCBA).

It may be useful to calibrate temperature monitoring circuitry of a given IC by querying the IC for temperature readings from its thermal sensing devices, and comparing the temperature readings to a reference temperature of an environment in which the IC is being maintained. However, despite an IC being maintained during calibration within an environment at a reference temperature, self-heating of the IC die due to operation of self-heating components in the IC may result in actual temperatures at locations within the IC being significantly higher than the reference temperature. This may lead to inaccurate calibration. While, in a highly-controlled lab environment, calibration may be attempted while power supplies and internal self-heating components within an IC are disabled and are thus not contributing to internal self-heating, it may not be possible or desirable to disable such elements for calibration while the IC is deployed in mission mode (i.e., while IC circuitry for performing intended functions of the IC is enabled so the IC may function as intended in a system, as contrasted for example with a test mode during which IC circuitry for performing intended functions of the IC may be deliberately at least partly disabled for testing the IC).

SUMMARY

This disclosure relates generally to integrated circuits, and in particular, to an integrated circuit and method for capturing die temperature data for temperature calibration.

An aspect of the disclosed embodiments is a method for capturing integrated circuit (IC) die temperature data. The method includes, responsive to an application of power to the IC, self-initializing the IC by asserting a reset signal for a reset period. The self-initializing also includes, in response to an expiration of the reset period, deasserting the reset signal. The self-initializing also includes, responsive to deasserting the reset signal, automatically obtaining first temperature data from at least one thermal sensing device associated with a die of the IC, and storing the first temperature data in a storage component of the IC.

Another aspect of the disclosed embodiments is an integrated circuit (IC). The IC includes at least one thermal sensing device. The IC also includes self-initializing logic configured to, responsive to an application of power to the IC, assert a reset signal for a reset period and, after expiry of the reset period, deassert the reset signal. The self-initializing logic is also configured to, responsive to the reset signal being deasserted, automatically obtain first temperature data from the at least one thermal sensing device and store the first temperature data in a storage component of the IC.

These and other aspects of the present disclosure are provided in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, integrated circuits (IC), such as analog signal ICs, digital signal ICs, or mixed signal ICs, typically comprise a set of electronic components, such as transistors or other suitable components, inseparably integrated on a small portion of semiconductor material (e.g., silicon or other suitable material) called a die. Modern ICs may integrate millions or billions of electronic components on a die, and may be used in various automotive applications, such as engine control units, power drive systems and antilock brake systems, and other kinds of applications such as desktop computers, laptop computers, mobile computing devices, tablet computing devices, home appliances, stereos, medical devices, and other electronic devices.

An IC is typically connected, using solder or other thermally conductive material, to a printed circuit board (PCB) substrate, which electrically connects other ICs and electronic components on the PCB. For example, one or more leads of the IC may be soldered (e.g., thermally attached) to the substrate to electrically connect the IC to the other ICs and electronic components on the PCB and/or to one another. The solder, such as a lead alloy solder or other suitable solder, provides a conductive path for electrons to flow to and from the IC via the substrate. Typically, solder and flux (e.g., a paste that promotes solder flow) are applied to the PCB using a suitable manufacturing process to secure and electrically connect the IC, and other electronic components, to the PCB (e.g., typically referred to as a PCB assembly (PCBA) when the ICs and electronic components are secured and electrically connected to the PCB).

During manufacturing of PCBAs, solder between ICs and/or other electronic components may be insufficiently applied, resulting in faulty solder connections. Faulty solder connections (e.g., solder voids or other faulty solder connection) are relatively common and degrade thermal interfaces (e.g., connections between ICs and/or other electronic components and the substrate). For example, under certain circumstances (e.g., increased thermal conditions resulting from high power being applied to the ICs and/or electronic components) in production (e.g., in a production environment, such as an end user environment, and the like) the solder connection between, for example, the IC and the substrate of the PCB may be inadequate (e.g., due to the insufficiently applied solder). This may cause the IC to overheat or enter thermal shutdown preventing the IC from interacting with other components on the PCB and/or other system components associated therewith. Such faulty solder connections may result from component tolerance issues, leadform stamping tolerances, solder printing tolerances, and the like and are often not detected in the production environment.

Temperature monitoring circuitry, including one or more thermal sensing devices at respective locations on the IC die, may be incorporated so that temperatures at the respective locations may be monitored and/or used to modify operation of the IC and/or used to determine the integrity of thermal paths from the IC to the printed circuit board assembly (PCBA). It may be useful to calibrate temperature monitoring circuitry of a given IC by querying the IC for temperature readings from its thermal sensing devices, and comparing the temperature readings to a reference temperature of an environment in which the IC is being maintained. However, despite an IC being maintained during calibration within an environment at a reference temperature, self-heating of the IC die due to operation of self-heating components in the IC may result in actual temperatures at locations within the IC being significantly higher than the reference temperature. This may lead to inaccurate calibration. While, in a highly-controlled lab environment, calibration may be attempted while power supplies and internal self-heating components within an IC are disabled and are thus not contributing to internal self-heating, it may not be possible or desirable to disable such elements for calibration while the IC is deployed in mission mode.

Accordingly, systems and methods, such as those described herein, that obtain first temperature data from at least one thermal sensing device associated with the die of the IC responsive to deassertion of a reset signal asserted responsive to an application of power to the IC, may be desirable. Obtaining temperature data responsive to the deassertion of the reset signal may enable the first temperature data to be obtained after power has been applied to the components of the IC, including the self-heating components, but before any or very much self-heating has yet occurred. Such first temperature data may therefore be very little reflective of, or unreflective of, self-heating, such that the first temperature data may be deemed to be sufficiently accurate baseline temperature data.

Figure 1:
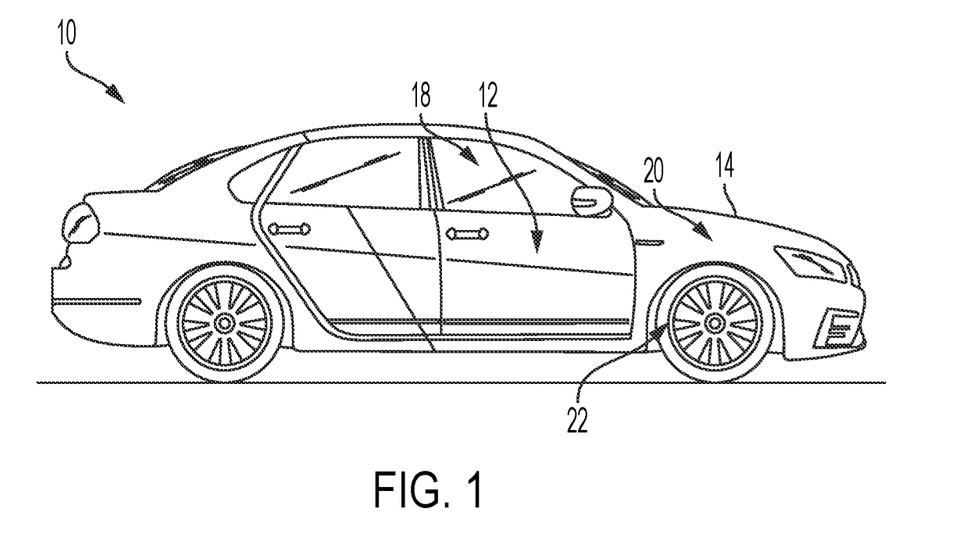
FIG. 1 generally illustrates a vehicle according to the principles of the present disclosure.

FIG. 1 generally illustrates a vehicle 10 according to the principles of the present disclosure. The vehicle 10 may include any suitable vehicle, such as a car, a truck, a sport utility vehicle, a mini-van, a cross-over, any other passenger vehicle, any suitable commercial vehicle, or any other suitable vehicle. While the vehicle 10 is illustrated as a passenger vehicle having wheels and for use on roads, the principles of the present disclosure may apply to other vehicles, such as planes, boats, trains, drones, or other suitable vehicles. The vehicle 10 includes a vehicle body 12 and a hood 14. A portion of the vehicle body 12 defines a passenger compartment 18. Another portion of the vehicle body 12 defines the engine compartment 20. The hood 14 may be moveably attached to a portion of the vehicle body 12, such that the hood 14 provides access to the engine compartment 20 when the hood 14 is in a first or open position and the hood 14 covers the engine compartment 20 when the hood 14 is in a second or closed position.

The passenger compartment 18 is disposed rearward of the engine compartment 20. The vehicle 10 may include any suitable propulsion system including an internal combustion engine, one or more electric motors (e.g., an electric vehicle), one or more fuel cells, a hybrid (e.g., a hybrid vehicle) propulsion system comprising a combination of an internal combustion engine, one or more electric motors, and/or any other suitable propulsion system. In some embodiments, the vehicle 10 may include a petrol or gasoline fuel engine, such as a spark ignition engine. In some embodiments, the vehicle 10 may include a diesel fuel engine, such as a compression ignition engine. The engine compartment 20 houses and/or encloses at least some components of the propulsion system of the vehicle 10. Additionally, or alternatively, propulsion controls, such as an accelerator actuator (e.g., an accelerator pedal), a brake actuator (e.g., a brake pedal), a steering wheel, and other such components are disposed in the passenger compartment 18 of the vehicle 10. The propulsion controls may be actuated or controlled by a driver of the vehicle 10 and may be directly connected to corresponding components of the propulsion system, such as a throttle, a brake, a vehicle axle, a vehicle transmission, and the like, respectively. In some embodiments, the propulsion controls may communicate signals to a vehicle computer system (e.g., drive by wire) which in turn may control the corresponding propulsion component of the propulsion system.

The vehicle computer system may include various electrical and electronic components for control of the propulsion components of the propulsion system and for control of other vehicle subsystems, such as antilock braking, vehicle signaling, entertainment, and other subsystems. Such components may be powered by one or more vehicle batteries housed within the engine compartment 20 or within another location in the vehicle 10, and may include one or more integrated circuits for handling signal processing, power conditioning, and other functions for the various subsystems of vehicle 10 that are controlled by the vehicle computer system.

In some embodiments, the vehicle 10 includes a transmission in communication with a crankshaft via a flywheel or clutch or fluid coupling. In some embodiments, the transmission includes a manual transmission. In some embodiments, the transmission includes an automatic transmission. The vehicle 10 may include one or more pistons, in the case of an internal combustion engine or a hybrid vehicle, which cooperatively operate with the crankshaft to generate force, which is translated through the transmission to one or more axles, which turns wheels 22. When the vehicle 10 includes one or more electric motors, a vehicle battery and/or fuel cell provides energy to the electric motors to turn the wheels 22. In cases where the vehicle 10 includes a vehicle battery to provide energy to the one or more electric motors, when the battery is depleted, it may be connected to an electric grid (e.g., using a wall socket) to recharge the battery cells. Additionally, or alternatively, the vehicle 10 may employ regenerative braking which uses the one or more electric motors of the vehicle 10 as a generator to convert kinetic energy lost due to decelerating back into stored energy in the battery.

The vehicle 10 may include automatic vehicle propulsion systems, such as a cruise control, an adaptive cruise control, automatic braking control, other automatic vehicle propulsion systems, or a combination thereof. The vehicle 10 may be an autonomous or semi-autonomous vehicle, or other suitable type of vehicle. The vehicle 10 may include additional or fewer features than those generally illustrated and/or disclosed herein.

Figure 2:
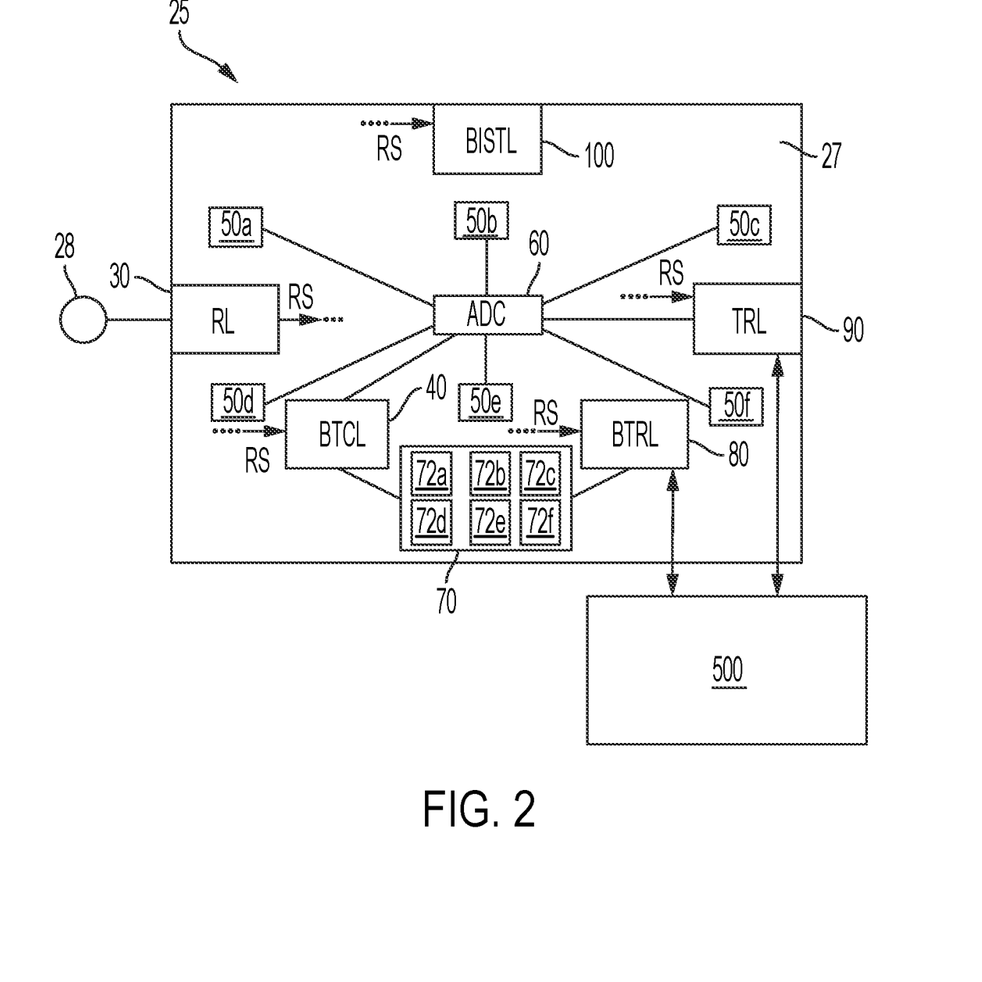
FIG. 2 generally illustrates an integrated circuit configured to receive power from a battery of the vehicle according to the principles of the present disclosure.

FIG. 2 generally illustrates an integrated circuit (IC) 25 according to the principles of the present disclosure. IC 25 may be configured for a suitable application, such as for use in a propulsion system, an anti-lock braking system, or some other electrical control or processing system. IC 25 may include a plurality of electrical components inseparably integrated and/or disposed on a segment of semiconductor material, such as silicon or other suitable semiconductor material, known as a die 27. IC 25 may comprise a microprocessor, a microcontroller, a memory chip, an application-specific integrated circuit (ASIC), a field-programmable gate array (FPGA), a sensor, a power management circuit, an operation amplifier, an analog-to-digital converter, a digital-to-analog converter, or other suitable IC. Additionally, or alternatively, IC 25 may comprise an analog signal IC, a digital signal IC, or a mixed signal IC. IC 25 may interact with one or more other ICs on the same PCBA or on another PCBA included as part of the system.

IC 25 may be configured with logic blocks of components assembled generally as a group on die 27 to implement a logical sub-function of IC 25. Shown in FIG. 2 are logic blocks and components for self-initialization including reset and temperature capture, as well as temperature retrieval of IC 25 according to the disclosure. Logic blocks and components for application-specific functions, such as for power drive functions involving signal processing and/or power management, are not shown explicitly but should be understood to also be present at respective locations on die 27 of IC 25.

During manufacturing of PCBAs having ICs with a similar design to the IC 25, the ICs may be tested to verify sufficiency of thermal paths associated with the ICs. The ICs may be tested at in-circuit test, middle of the line, end of the line, at warranty testing, or a combination thereof. A thermal path associated with a respective IC may include solder connections between the IC and an associated PCB and/or other suitable thermal interfaces or connections. If, during testing, a thermal path associated with the IC is determined to be intermediate or insufficient, the assembly of the PCBA may then be adjusted or repaired in order to correct the insufficient thermal path.

In some embodiments, IC 25 may include self-initializing logic configured to self-initialize IC 25 responsive to an application of power to IC from a vehicle battery or other power source 28. During self-initialization, IC 25 is being prepared for operation with and by other components of vehicle 10 including capturing its own baseline die temperature data, as described herein. Power source 28 may include a current source, a voltage source, or other suitable power source. Power source 28 may include a power circuit comprising a voltage source, one or more resistors, one or more capacitors, and/or one or more other suitable electrical components. When power (e.g., voltage and/or current) is supplied by power source 28, the power flows through components of IC 25 and into a substrate of a PCB (not shown) via thermal connections between IC 25 and the substrate.

In some embodiments, the self-initializing logic may include reset logic (RL) 30 configured to assert a reset signal RS. RL 30 is configured to assert reset signal RS for a reset period after the application of the power by power source 28 to IC 25. Other logic blocks of IC 25 may be signaled by the assertion of reset signal RS and responsive to the assertion of reset signal RS may, during the reset period, enter a reset state during which internal logic states of the logic blocks may be set to known logical starting conditions. After the reset period, RL 30 may deassert reset signal RS. Logic blocks of IC 25 may be signaled by the deassertion of reset signal RS. Responsive to the deassertion of reset signal RS, the logic blocks may exit the reset state.

In some embodiments, IC 25 includes one or more thermal sensing devices, such as one or more thermal sensing devices 50a-f at respective locations on die 27. Thermal sensing devices 50a-f may sense temperatures of die 27 at their respective locations. In some embodiments, each of thermal sensing devices 50a-f is a thermal sensing diode. In some embodiments, an analog-to-digital converter (ADC) 60 may be configured to digitally sample an electrical characteristic of thermal sensing devices 50a-f according to a sampling period (i.e., in round-robin fashion), thereby to obtain temperature data from each thermal sensing device 50a-f via ADC 60. In other embodiments, individual ADCs may be associated with respective thermal sensing devices thereby to obtain temperature data from the thermal sensing devices simultaneously. In some embodiments, the electric characteristic of a thermal sensing device is a voltage across the thermal sensing device, with the voltage across the thermal sensing device changing according to temperature changes of the thermal sensing device. In some embodiments the electric characteristic is a resistance of the thermal sensing device, with the resistance of the thermal sensing device changing according to temperature changes of the thermal sensing device.

In some embodiments, self-initializing logic may include baseline temperature capture logic (BTCL) 40 that is configured to be responsive to reset signal RS from RL 30 being deasserted after the expiration of the reset period. Responsive to reset signal RS being deasserted, BTCL 40 may automatically obtain first temperature data from each of thermal sensing devices 50a-f. BTCL 40 may be configured to store the first temperature data in a storage component 70 of IC 25. By automatically obtaining first temperature data from the thermal sensing devices 50a-f and storing the first temperature data in storage component 70 responsive to reset signal RS being deasserted, IC 25 may obtain the first temperature data before significant self-heating of IC 25 has been allowed to occur, and without intervention from a device, such as device 500, that is external to IC 25. The first temperature data may therefore be regarded as baseline temperature data for each of thermal sensing devices 50a-f of IC 25. As used herein, device 500 may be any device in communication with IC 25, such as a master control unit (MCU), an engine control unit (ECU), another IC, or some other device arranged within vehicle 10 to communicate with IC 25. References to device 500 communicating with and/or receiving information from IC 25 are not intended to be restricted to IC 25 communicating only with a single device or kind of device. For example, depending on how the vehicle control system is configured, different devices having features similar to device 500 may communicate with and/or receive information from IC 25 as described herein. However, only a single device 500 is shown and described for ease of explanation.

In some embodiments, storage component 70 includes individual registers 72a-f for storing the first temperature data of respective thermal sensing devices 50a-f.

In some embodiments, the self-initialization logic of IC 25 includes built in self test logic (BISTL) 100, also responsive to deassertion of reset signal RS, to conduct a built in self test (BIST) of IC 25. A BIST is a routine conducted by BISTL 100 after IC 25 has exited the reset state and prior to IC 25 entering a normal (or operating) state. The BIST is for testing logic blocks and components of IC 25 to ensure they are operating correctly. Conducting a BIST may cause some heating of components at various locations on die 27. Therefore, in some embodiments, BISTL 100 may be configured to conduct the BIST only after the first temperature data is stored by BTCL 40. However, in other embodiments, where conducting a BIST does not itself cause significant heating of components, BISTL 100 may be configured to conduct a BIST prior to the first temperature data being obtained by BTCL 40.

In some embodiments, IC 25 includes baseline temperature retrieval logic (BTRL) 80 and temperature read logic (TRL) 90. In some embodiments, BTRL 80 is configured to receive a baseline temperature retrieval request from a device such as device 500. Herein, a device when making a request of IC 25 may be referred to as a requesting device. BTRL 80 is configured to, responsive to the baseline temperature retrieval request, retrieve the first temperature data from storage component 70 and to provide the retrieved first temperature data to device 500. A device such as device 500 may therefore have continued access, long after power has been first applied to IC 25 and after IC 25 has been self-initialized, to retrieve the baseline temperatures that had been captured by BTCL 40 during self-initialization.

In some embodiments, TRL 90 is configured to be responsive to receipt of a temperature read request from a device such as device 500 to obtain at least second temperature data from each of thermal sensing devices 50a-f and to provide the second temperature data to device 500. In some embodiments, TRL 90 may cause ADC 60 to digitally sample the electrical characteristics of thermal sensing devices 50a-f, in a similar manner to that described herein in connection with BTCL 40 obtaining the first temperature data. Second temperature data, and any third or additional temperature data obtained responsive to additional temperature read requests from device 500, may be regarded as current temperature data as at the time of a temperature read request. A device such as device 500 may therefore have continued access, via TRL 90, to current temperature data respective temperatures at various locations within die 27.

In some embodiments, a device such as device 500 may use the first temperature data retrieved from storage component 70 as baseline temperature data when making determinations, along with second and subsequent temperature data, about temperature rise rates at various locations within die 27. Such determinations may be useful for determining whether thermal paths are sufficient. In addition to the first temperature data being available as described herein to a device such as device 500, in some embodiments the first temperature data may be available to one or more logic blocks of IC 25, which may retrieve and use the first temperature data during initialization and/or operation of one or more of the logic blocks of IC 25.

In some embodiments, self-initializing logic may include other configurations of logic blocks or a single logic block for conducting reset and obtaining and storing temperatures of the at least one thermal sensing device. In some embodiments, self-initializing logic may include other configurations of logic blocks or a single logic block for conducting a built in self-test. In some embodiments, self-initializing logic may not include any logic blocks for conducting a built in self test. In some embodiments, assertion and deassertion of a reset signal may be done by logic on a device that is external to the IC, such that the IC is responsive to the assertion and deassertion of a reset signal that is controlled by and conveyed to the IC by reset logic on the other device, such that IC does not itself generate or assert/deassert the reset signal itself. Variations are possible.

Figure 3:
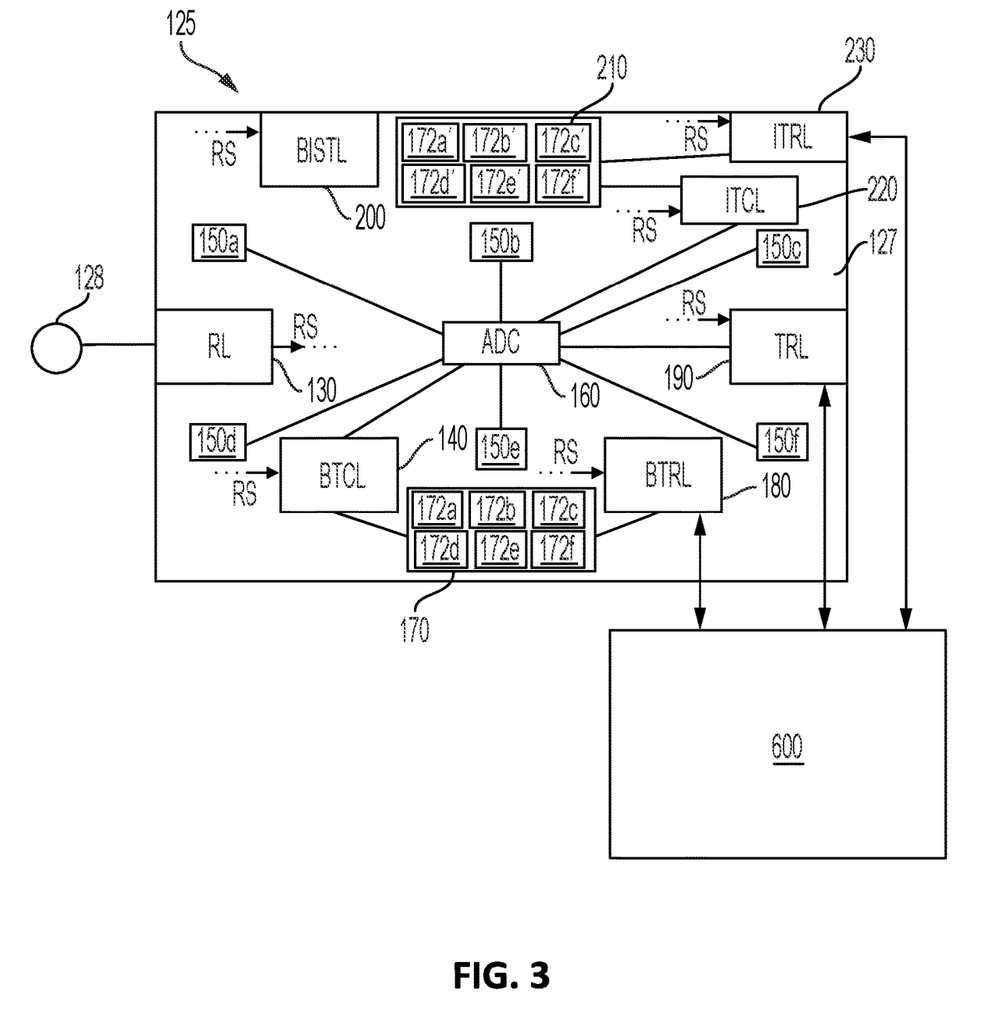
FIG. 3 generally illustrates another integrated circuit configured to receive power from a battery of the vehicle according to the principles of the present disclosure.

FIG. 3 generally illustrates an integrated circuit (IC) 125 according to the principles of the present disclosure. IC 125 may be configured for a suitable application, such as for use in a propulsion system, an anti-lock braking system, or some other electrical control or processing system. IC 125 may include a plurality of electrical components inseparably integrated and/or disposed on a segment of semiconductor material, such as silicon or other suitable semiconductor material, known as a die 127. IC 125 may comprise a microprocessor, a microcontroller, a memory chip, an application-specific integrated circuit (ASIC), a field-programmable gate array (FPGA), a sensor, a power management circuit, an operation amplifier, an analog-to-digital converter, a digital-to-analog converter, or other suitable IC. Additionally, or alternatively, IC 125 may comprise an analog signal IC, a digital signal IC, or a mixed signal IC. IC 125 may interact with one or more other ICs on the same PCBA or on another PCBA included as part of the system.

IC 125 may be configured with logic blocks of components assembled generally as a group on die 127 to implement a logical sub-function of IC 125. Shown in FIG. 3 are logic blocks and components for self-initialization including reset and temperature capture, as well as temperature retrieval of IC 125 according to the disclosure. Logic blocks and components for application-specific functions, such as for power drive functions involving signal processing and/or power management, are not shown explicitly but should be understood to also be present at respective locations on die 127 of IC 125.

During manufacturing of PCBAs having ICs with a similar design to the IC 125, the ICs may be tested to verify sufficiency of thermal paths associated with the ICs. The ICs may be tested at in-circuit test, middle of the line, end of the line, at warranty testing, or a combination thereof. A thermal path associated with a respective IC may include solder connections between the IC and an associated PCB and/or other suitable thermal interfaces or connections. If, during testing, a thermal path associated with the IC is determined to be intermediate or insufficient, the assembly of the PCBA may then be adjusted or repaired in order to correct the insufficient thermal path.

In some embodiments, IC 125 may include self-initializing logic configured to self-initialize IC 125 responsive to an application of power to IC from a vehicle battery or other power source 128. During self-initialization, IC 125 is being prepared for operation with and by other components of vehicle 10 including capturing its own baseline die temperature data, as described herein. Power source 128 may include a current source, a voltage source, or other suitable power source. Power source 128 may include a power circuit comprising a voltage source, one or more resistors, one or more capacitors, and/or one or more other suitable electrical components. When power (e.g., voltage and/or current) is supplied by power source 128, the power flows through components of IC 125 and into a substrate of a PCB (not shown) via thermal connections between IC 125 and the substrate.

In some embodiments, the self-initializing logic may include reset logic (RL) 130 configured to assert a reset signal RS. RL 130 is configured to assert reset signal RS for a reset period after the application of the power by power source 128 to IC 125. Other logic blocks of IC 125 may be signaled by the assertion of reset signal RS and responsive to the assertion of reset signal RS may, during the reset period, enter a reset state during which internal logic states of the logic blocks may be set to known logical starting conditions. After the reset period, RL 130 may deassert reset signal RS. Logic blocks of IC 125 may be signaled by the deassertion of reset signal RS. Responsive to the deassertion of reset signal RS, the logic blocks may exit the reset state.

In some embodiments, IC 125 includes one or more thermal sensing devices, such as one or more thermal sensing devices 150a-f at respective locations on die 127. Thermal sensing devices 150a-f may sense temperatures of die 127 at their respective locations. In some embodiments, each of thermal sensing devices 150a-f is a thermal sensing diode. In some embodiments, an analog-to-digital converter (ADC) 160 may be configured to digitally sample an electrical characteristic of thermal sensing devices 150a-f according to a sampling period (i.e., in round-robin fashion), thereby to obtain temperature data from each thermal sensing device 150a-f via ADC 160. In other embodiments, individual ADCs may be associated with respective thermal sensing devices thereby to obtain temperature data from the thermal sensing devices simultaneously. In some embodiments, the electric characteristic of a thermal sensing device is a voltage across the thermal sensing device, with the voltage across the thermal sensing device changing according to temperature changes of the thermal sensing device. In some embodiments the electric characteristic is a resistance of the thermal sensing device, with the resistance of the thermal sensing device changing according to temperature changes of the thermal sensing device.

In some embodiments, self-initializing logic may include baseline temperature capture logic (BTCL) 140 that is configured to be responsive to reset signal RS from RL 130 being deasserted after the expiration of the reset period. Responsive to reset signal RS being deasserted, BTCL 140 may automatically obtain first temperature data from each of thermal sensing devices 150a-f. BTCL 140 may be configured to store the first temperature data in a storage component 170 of IC 125. By automatically obtaining first temperature data from the thermal sensing devices 150a-f and storing the first temperature data in storage component 170 responsive to reset signal RS being deasserted, IC 125 may obtain the first temperature data before significant self-heating of IC 125 has been allowed to occur, and without intervention from a device, such as device 600, that is external to IC 125. The first temperature data may therefore be regarded as baseline temperature data for each of thermal sensing devices 150a-f of IC 125. As used herein, device 600 may be any device in communication with IC 125, such as a master control unit (MCU), an engine control unit (ECU), another IC, or some other device arranged within vehicle 10 to communicate with IC 125. References to device 600 communicating with and/or receiving information from IC 125 are not intended to be restricted to IC 125 communicating only with a single device or kind of device. For example, depending on how the vehicle control system is configured, different devices having features similar to device 600 may communicate with and/or receive information from IC 125 as described herein. However, only a single device 600 is shown and described for ease of explanation.

In some embodiments, storage component 170 includes individual registers 172a-f for storing the first temperature data of respective thermal sensing devices 150a-f.

In some embodiments, the self-initialization logic of IC 125 includes built in self test logic (BISTL) 200, also responsive to deassertion of reset signal RS, to conduct a built in self test (BIST) of IC 125. A BIST is a routine conducted by BISTL 200 after IC 125 has exited the reset state and prior to IC 125 entering a normal (or operating) state. The BIST is for testing logic blocks and components of IC 125 to ensure they are operating correctly. Conducting a BIST may cause some heating of components at various locations on die 127. Therefore, in some embodiments, BISTL 200 may be configured to conduct the BIST only after the first temperature data is stored by BTCL 140. However, in other embodiments, where conducting a BIST does not itself cause significant heating of components, BISTL 200 may be configured to conduct a BIST prior to the first temperature data being obtained by BTCL 140.

In some embodiments, IC 125 includes baseline temperature retrieval logic (BTRL) 180 and temperature read logic (TRL) 190. In some embodiments, BTRL 180 is configured to receive a baseline temperature retrieval request from a device such as device 600. Herein, a device when making a request of IC 125 may be referred to as a requesting device. BTRL 180 is configured to, responsive to the baseline temperature retrieval request, retrieve the first temperature data from storage component 170 and to provide the retrieved first temperature data to device 600. A device such as device 600 may therefore have continued access, long after power has been first applied to IC 125 and after IC 125 has been self-initialized, to retrieve the baseline temperatures that had been captured by BTCL 140 during self-initialization.

In some embodiments, TRL 190 is configured to be responsive to receipt of a temperature read request from a device such as device 600 to obtain at least second temperature data from each of thermal sensing devices 150a-f and to provide the second temperature data to device 600. In some embodiments, TRL 190 may cause ADC 160 to digitally sample the electrical characteristics of thermal sensing devices 150a-f, in a similar manner to that described herein in connection with BTCL 140 obtaining the first temperature data. Second temperature data, and any third or additional temperature data obtained responsive to additional temperature read requests from device 600, may be regarded as current temperature data as at the time of a temperature read request. A device such as device 600 may therefore have continued access, via TRL 190, to current temperature data respective temperatures at various locations within die 127.

In some embodiments, a device such as device 600 may use the first temperature data retrieved from storage component 170 as baseline temperature data when making determinations, along with second and subsequent temperature data, about temperature rise rates at various locations within die 127. Such determinations may be useful for determining whether thermal paths are sufficient. In addition to the first temperature data being available as described herein to a device such as device 600, in some embodiments the first temperature data may be available to one or more logic blocks of IC 125, which may retrieve and use the first temperature data during initialization and/or operation of one or more of the logic blocks of IC 125.

In some embodiments, self-initializing logic may include other configurations of logic blocks or a single logic block for conducting reset and obtaining and storing temperatures of the at least one thermal sensing device. In some embodiments, self-initializing logic may include other configurations of logic blocks or a single logic block for conducting a built in self-test. In some embodiments, self-initializing logic may not include any logic blocks for conducting a built in self test. In some embodiments, assertion and deassertion of a reset signal may be done by logic on a device that is external to the IC, such that the IC is responsive to the assertion and deassertion of a reset signal that is controlled by and conveyed to the IC by reset logic on the other device, such that IC does not itself generate or assert/deassert the reset signal itself. Variations are possible.

In some embodiments, IC 125 may include interim temperature capture logic (ITCL) 220 that is configured to automatically obtain third temperature data from each of thermal sensing devices 150a-f at some time after initialization when self-heating may have occurred due to operation of IC 125. ITCL 220 may be configured to store the third temperature data in a storage component 210 of IC 125. By automatically obtaining the third temperature data from the thermal sensing devices 150a-f and storing the third temperature data in storage component 210, IC 125 may obtain the third temperature data after self-heating of IC 125 has occurred, and without intervention from a device, such as device 500. The third temperature data may therefore be regarded as interim temperature data for each of thermal sensing devices 150a-f of IC 125. Capture and storage of such interim temperature data may be used along with the baseline temperature data described herein to determine temperature rise rates at locations of die 127 or to enable IC 125 to automatically detect temperature(s) rising above a threshold temperature and/or threshold temperatures, without requiring intervention or requests from a device such as device 600. IC 125 may include logic blocks for enabling IC 125 to self-regulate its operation based on such automatic detection of temperature rises in relation to the threshold temperature and/or threshold temperatures. As used herein, device 600 may be any device in communication with IC 125, such as a master control unit (MCU), an engine control unit (ECU), another IC, or some other device arranged within vehicle 10 to communicate with IC 125. References to device 600 communicating with and/or receiving information from IC 125 are not intended to be restricted to IC 125 communicating only with a single device or kind of device. For example, depending on how the vehicle control system is configured, different devices having features similar to device 600 may communicate with and/or receive information from IC 125 as described herein. However, only a single device 600 is shown and described for ease of explanation.

In some embodiments, storage component 210 includes individual registers 172a'-f' for storing the third temperature data of respective thermal sensing devices 150a-f.

In some embodiments, IC 125 includes interim temperature retrieval logic (ITRL) 230. In some embodiments, ITRL 230 is configured to receive an interim temperature retrieval request from a device such as device 600. Herein, a device when making a request of IC 125 may be referred to as a requesting device. ITRL 230 is configured to, responsive to the interim temperature retrieval request, retrieve the third temperature data from storage component 210 and to provide the retrieved third temperature data to device 600. A device such as device 600 may therefore have continued access, long after power has been first applied to IC 125 and after IC 125 has been self-initialized, to retrieve the interim temperatures that had been captured by ITCL 220 during self-initialization.

In some embodiments, a device such as device 600 may use the first temperature data retrieved from storage component 170 as baseline temperature data when making determinations, along with third temperature data retrieved from storage component 210 as interim temperature data, and any additional temperature data retrieved via TRL 190, about temperature rise rates at various locations within die 127. Such determinations may be useful for determining whether thermal paths are sufficient. In addition to the third temperature data being available as described herein to a device such as device 600, in some embodiments the third temperature data may be available to one or more logic blocks of IC 125, which may retrieve and use the third temperature data during operation of one or more of the logic blocks of IC 125.

Figure 4A:
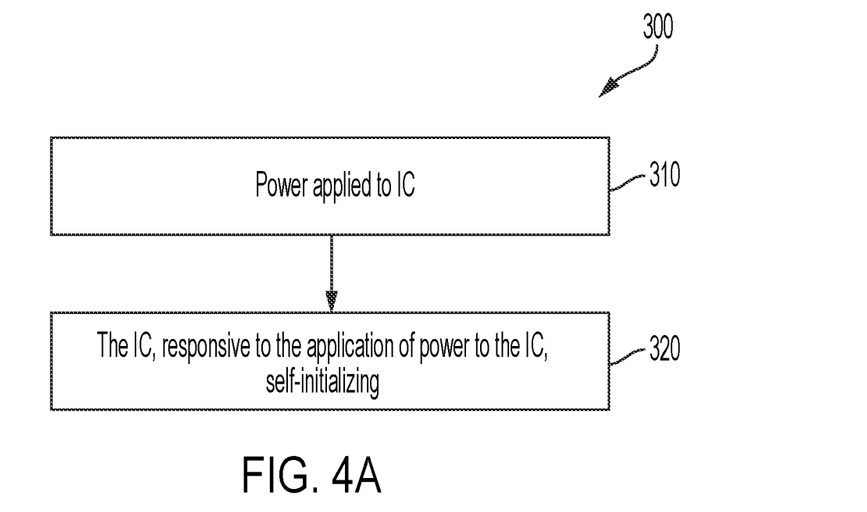
FIG. 4A is a flow diagram generally illustrating an integrated circuit die temperature data capture method according to the principles of the present disclosure.

FIG. 4A is a flow diagram generally illustrating an integrated circuit (IC) die temperature capture method 300 according to the principles of the present disclosure. In some embodiments, at 310, power is applied to the IC and, at 320, the IC, responsive to the application of power to the IC, self-initializes.

Figure 4B:
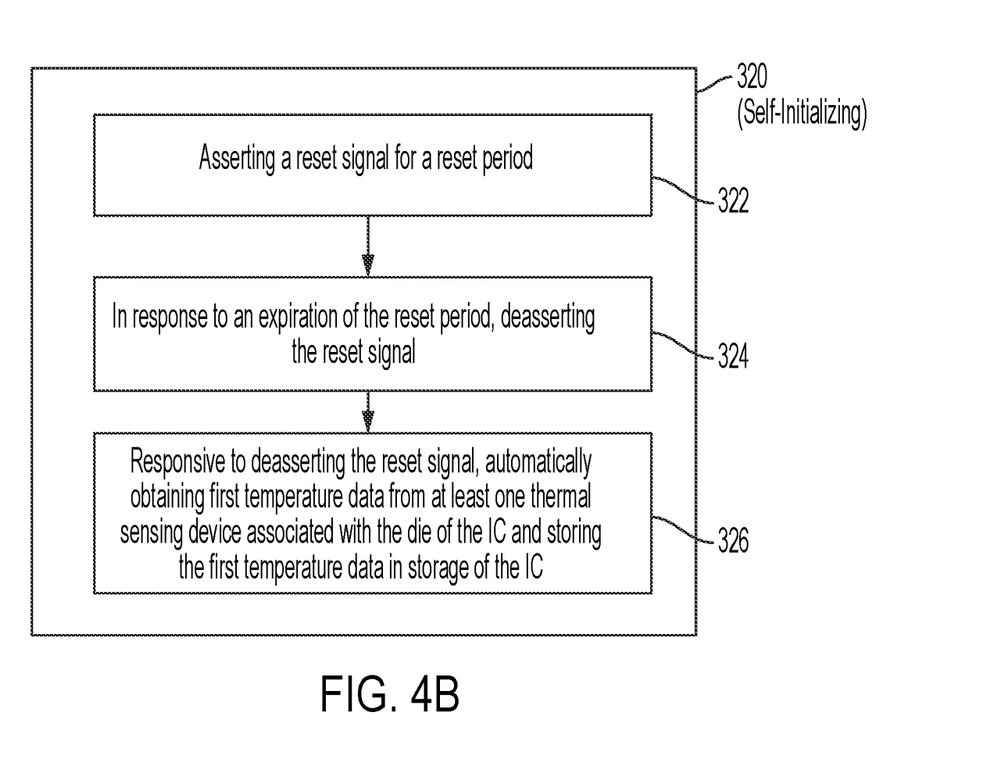
FIG. 4B is a flow diagram generally illustrating aspects of self-initializing in the integrated circuit die temperature data capture method of FIG. 4A according to principles of the present disclosure.

FIG. 4B is a flow diagram illustrating, in further detail, general aspects of the self-initializing at 320 in FIG. 4A according to principles of the present disclosure. In some embodiments, the self-initializing includes, at 322, asserting a reset signal for a reset period. At 324, the self-initializing includes, in response to an expiration of the reset period, deasserting the reset signal. At 326, the self-initializing includes, responsive to the reset signal being deasserted, automatically obtaining first temperature data from at least one thermal sensing device associated with a die of the IC. At 326, the self-initializing also includes storing the first temperature data in a storage component of the IC.

In some embodiments, the self-initializing further includes, responsive to deasserting the reset signal, conducting a built in self test (BIST) of the IC. In some embodiments, conducting the BIST includes conducting the BIST after the storing. As a BIST may itself cause components, and thus the die, to self-heat, conducting the BIST after the storing may ensure the first temperature data is not influenced by component self-heating due to conducting the BIST. However, in some embodiments, conducting the BIST includes conducting the BIST before the obtaining of the first temperature data. In some embodiments, conducting the BIST includes conducting the BIST while the first temperature data is being obtained.

In some embodiments, storing the first temperature data in the storage component of the IC includes storing the first temperature data obtained from the at least one thermal sensing device in a respective register in the IC.

In some embodiments, obtaining the first temperature data from the at least one thermal sensing device associated with the die of the IC includes digitally sampling an electrical characteristic of the at least one thermal sensing device.

In some embodiments, the at least one thermal sensing devices includes a plurality of thermal sensing devices, and digitally sampling includes, using an analog-to-digital converter (ADC), digitally sampling the electrical characteristic of each of the plurality of the thermal sensing devices according to a sampling period.

In some embodiments, the method includes receiving, from a requesting device, a temperature read request, responsive to receiving the temperature read request, obtaining second temperature data from the at least one thermal sensing device, and providing the second temperature data to the requesting device. In some embodiments, obtaining second temperature data from the at least one thermal sensing device includes digitally sampling an electrical characteristic of the at least one thermal sensing device.

In some embodiments, the method includes receiving, from a requesting device, a baseline temperature retrieval request, responsive to receiving the baseline temperature retrieval request, retrieving the first temperature data from the storage component of the IC, and providing the first temperature data retrieved from the storage component of the IC to the requesting device.

In some embodiments, the at least one thermal sensing device includes a thermal sense diode.

In some embodiments, at some time after initialization and responsive to an elapsed time or to another threshold condition being satisfied, third temperature data may be automatically obtained by the IC from at least one of the thermal sensing devices. In some embodiments, the third temperature data may be stored in a storage component of the IC as interim temperature data. In some embodiments, storing the third temperature data in the storage component of the IC includes storing the third temperature data obtained from the at least one thermal sensing device in a respective register in the IC that is different from the register storing the respective first temperature data. The IC may therefore simultaneously store both the first—or baseline—temperature data and the third—or interim—temperature data, and may provide access by a device to the stored baseline and/or interim temperature data.

In some embodiments, obtaining the third temperature data from the at least one thermal sensing device associated with the die of the IC includes digitally sampling an electrical characteristic of the at least one thermal sensing device.

In some embodiments, the method includes receiving, from a requesting device, an interim temperature retrieval request, responsive to receiving the interim temperature retrieval request, retrieving the third temperature data from the storage component of the IC, and providing the third temperature data retrieved from the storage component of the IC to the requesting device.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, logic blocks, and other types of hardware or combination thereof. In other embodiments, a module can include memory that stores instructions executable by a controller to implement a feature of the module.

The above-described embodiments, implementations, and aspects have been described in order to allow easy understanding of the present invention and do not limit the present invention. On the contrary, the invention is intended to cover various modifications and equivalent arrangements included within the scope of the appended claims, which scope is to be accorded the broadest interpretation to encompass all such modifications and equivalent structure as is permitted under the law.

What is claimed is:

1. A method for capturing integrated circuit (IC) die temperature data, the method comprising:
   responsive to an application of power to the IC, self-initializing the IC by:
   asserting a reset signal for a reset period;
   in response to an expiration of the reset period, deasserting the reset signal; and
   responsive to deasserting the reset signal, automatically:

obtaining first temperature data from at least one thermal sensing device associated with a die of the IC; and storing the first temperature data in a storage component of the IC.

2. The method of claim 1, wherein self-initializing the IC further includes:

responsive to deasserting the reset signal, conducting a built in self test (BIST).

3. The method of claim 2, wherein conducting the BIST includes:

conducting the BIST after the storing.

4. The method of claim 1, wherein storing the first temperature data in the storage component of the IC includes:

storing the first temperature data obtained from the at least one thermal sensing device in a respective register in the IC.

5. The method of claim 1, wherein obtaining the first temperature data from the at least one thermal sensing device associated with the die of the IC includes:

digitally sampling an electrical characteristic of the at least one thermal sensing device.

6. The method of claim 5, wherein the at least one thermal sensing device includes a plurality of thermal sensing devices, wherein digitally sampling includes:

using an analog-to-digital converter (ADC), digitally sampling the electrical characteristic of each of the plurality of thermal sensing devices according to a sampling period.

7. The method of claim 1, further comprising:

receiving, from a requesting device, a temperature read request;

responsive to receiving the temperature read request, obtaining second temperature data from the at least one thermal sensing device; and providing the second temperature data to the requesting device.

8. The method of claim 7, wherein obtaining the second temperature data from the at least one thermal sensing device includes:

digitally sampling an electrical characteristic of the at least one thermal sensing device.

9. The method of claim 1, further comprising:

receiving, from a requesting device, a baseline temperature retrieval request;

responsive to receiving the baseline temperature retrieval request, retrieving the first temperature data from the storage component of the IC; and providing the first temperature data retrieved from the storage component of the IC to the requesting device.

10. The method of claim 1, wherein the at least one thermal sensing device includes a thermal sense diode.

11. An integrated circuit (IC) comprising:

at least one thermal sensing device; and self-initializing logic configured to, responsive to an application of power to the IC:

assert a reset signal for a reset period and, after expiry of the reset period, deassert the reset signal; and responsive to the reset signal being deasserted, automatically obtain first temperature data from the at least one thermal sensing device and store the first temperature data in a storage component of the IC.

12. The IC of claim 11, wherein the self-initializing logic is further configured to, responsive to the reset signal being deasserted:

conduct a built in self test (BIST).

13. The IC of claim 12, wherein the self-initializing logic is configured to conduct the BIST after the first temperature data is stored.

14. The IC of claim 11, wherein the self-initializing logic is configured to store the first temperature data from the at least one thermal sensing device in a respective register in the IC.

15. The IC of claim 11, wherein the self-initializing logic is configured to digitally sample an electrical characteristic of the at least one thermal sensing device.

16. The IC of claim 15, wherein the at least one thermal sensing device includes a plurality of thermal sensing devices, wherein the self-initializing logic is configured to, using an analog-to-digital converter (ADC), digitally sample the electrical characteristic of each of the plurality of thermal sensing devices according to a sampling period.

17. The IC of claim 11, further comprising:

temperature read logic configured to:

receive, from a requesting device, a temperature read request;

responsive to the temperature read request, obtain second temperature data from the at least one thermal sensing device; and provide the second temperature data to the requesting device.

18. The IC of claim 17, wherein the temperature read logic is configured to digitally sample an electrical characteristic of the at least one thermal sensing device.

19. The IC of claim 11, further comprising:

baseline temperature retrieval logic configured to:

receive, from a requesting device, a baseline temperature retrieval request;

responsive to the baseline temperature retrieval request, retrieve the first temperature data from the storage component of the IC; and provide the first temperature data retrieved from the storage component of the IC to the requesting device.

20. The IC of claim 11, wherein the at least one thermal sensing device includes a thermal sense diode.

* * * * *